(12) United States Patent
Zhang et al.

(10) Patent No.: US 9,368,422 B2
(45) Date of Patent: Jun. 14, 2016

(54) ABSORBING EXCESS UNDER-FILL FLOW WITH A SOLDER TRENCH

(71) Applicant: NVIDIA CORPORATION, Santa Clara, CA (US)

(72) Inventors: Leilei Zhang, Sunnyvale, CA (US); Ron Boja, Gilroy, CA (US); Abraham F. Yee, Cupertino, CA (US); Zuhair Bokharey, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 134 days.

(21) Appl. No.: 13/722,603

(22) Filed: Dec. 20, 2012

(65) Prior Publication Data

US 2014/0175681 A1  Jun. 26, 2014

(51) Int. Cl.
| | |
|---|---|
| *H01L 23/12* | (2006.01) |
| *H01L 23/48* | (2006.01) |
| *H01L 29/40* | (2006.01) |
| *H01L 23/31* | (2006.01) |
| *H01L 23/00* | (2006.01) |
| *H01L 21/56* | (2006.01) |

(52) U.S. Cl.
CPC .............. *H01L 23/31* (2013.01); *H01L 21/563* (2013.01); *H01L 24/32* (2013.01); *H01L 2224/16225* (2013.01); *H01L 2224/27013* (2013.01); *H01L 2224/32225* (2013.01); *H01L 2224/73204* (2013.01); *H01L 2924/15311* (2013.01)

(58) Field of Classification Search
CPC ............ H01L 2224/26175; H01L 2224/26145
USPC ........................... 257/782, 783, 787, 700, 701
See application file for complete search history.

(56) References Cited

U.S. PATENT DOCUMENTS

| | | | | |
|---|---|---|---|---|
| 4,857,989 | A * | 8/1989 | Mori et al. ..................... | 257/666 |
| 4,926,240 | A * | 5/1990 | Regione ........................ | 257/783 |
| 5,091,770 | A * | 2/1992 | Yamaguchi ................... | 257/701 |
| 6,448,507 | B1 * | 9/2002 | Fontecha et al. .............. | 174/260 |
| 6,946,741 | B2 * | 9/2005 | Yamashita .................... | 257/778 |
| 8,110,933 | B2 * | 2/2012 | Tomura et al. ................ | 257/787 |
| 2004/0262781 | A1 * | 12/2004 | Germain et al. .............. | 257/787 |
| 2007/0246842 | A1 * | 10/2007 | Takayanagi et al. .......... | 257/790 |
| 2008/0130241 | A1 | 6/2008 | Nagar et al. | |
| 2011/0204476 | A1 | 8/2011 | Kang et al. | |

FOREIGN PATENT DOCUMENTS

| | | |
|---|---|---|
| JP | 2001024017 A | 1/2001 |
| WO | 2005076352 A1 | 1/2005 |

* cited by examiner

*Primary Examiner* — Sheila V. Clark
(74) *Attorney, Agent, or Firm* — Artegis Law Group, LLP

(57) ABSTRACT

One embodiment sets forth an integrated circuit package that includes a substrate, one or more devices mounted on the substrate, a layer of under-fill configured to secure the one or more devices on the substrate, and a solder trench formed in the substrate, where the aggregate volume of the solder trench is large enough to capture a flow of excess under-fill during fabrication. One advantage of the disclosed integrated circuit package is that the solder trench is used in lieu of solder dam structures, thereby allowing a stencil to be lowered closer to the substrate surface during fabrication, which facilitates depositing solder paste during fabrication.

15 Claims, 5 Drawing Sheets

ABSORBING EXCESS UNDER-FILL FLOW WITH A SOLDER TRENCH

BACKGROUND OF THE INVENTION

1. Field of the Invention

The present invention generally relates to integrated circuit chip packaging, and, more specifically, to absorbing excess under-fill flow with a solder trench.

2. Description of the Related Art

Consumer demand for increasingly smaller electronic devices has grown dramatically, primarily in the form of thinner mobile phones and lighter laptops. Continued miniaturization of consumer electronic devices has generated a demand for thinner integrated circuit (IC) packages that incorporate the processing devices and memory devices that run consumer electronic devices. However, limits exist on what methods may be employed by IC package fabricators to further reduce the height of IC packages and yet continue producing IC packages precisely to the required specifications.

One common problem in the art is attempting to control the height of a "solder dam" when producing thin IC packages. A solder dam is formed around an IC that is mounted on a packaging substrate, and may be analogized to the walls of an above-ground pool, wherein the walls of the pool contain the water in the pool and prevent people outside the pool from getting wet. In the instant case, a solder dam contains "under-fill" and protects chip capacitors or other structures mounted on the packaging substrate from the flow of excess under-fill within the package. As is well-known, under-fill is used to support and secure various parts of the IC package.

During fabrication, a stencil is placed on a surface of a packaging substrate, and the holes of the stencil are used to precisely deposit solder paste onto targeted areas of the surface of the substrate. Because the solder dam protrudes above the surface of the packaging substrate, if the solder dam has too much height, the stencil cannot be placed in direct contact with the substrate surface, thereby reducing the precision of solder paste deposition. Furthermore, if the solder dam is misaligned, an outcome that is more likely as the height of the solder dam increases, the solder dam may cause the stencil to be placed askew, resulting in inaccurate deposition of solder paste. As a general matter, imprecise deposition of solder paste is undesirable because improper deposition may result in incomplete electrical connections in the IC package, which could cause the IC package to malfunction or become inoperable.

As the foregoing illustrates, there is a need in the art for a more effective way to guard against the flow of under-fill within an IC package.

SUMMARY OF THE INVENTION

One embodiment of the present invention sets forth an integrated circuit package that includes a substrate, one or more devices mounted on the substrate, a layer of under-fill configured to secure the one or more devices on the substrate, and a solder trench formed in the substrate, where the aggregate volume of the solder trench is large enough to capture a flow of excess under-fill during fabrication.

One advantage of the disclosed integrated circuit package is that the solder trench is used in lieu of solder dam structures, thereby allowing a stencil to be lowered closer to the substrate surface during fabrication, which facilitates depositing solder paste during fabrication.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
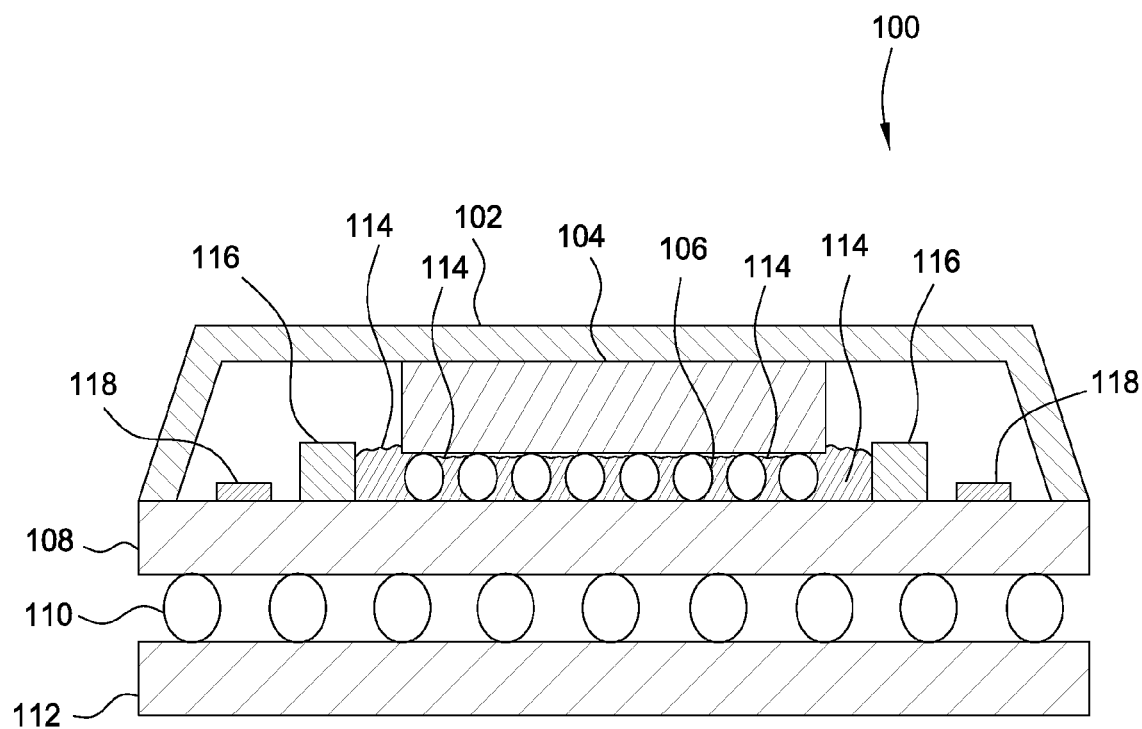
FIG. 1 illustrates a schematic, cross-sectional view of a conventional integrated circuit (IC) package.

FIG. 1 illustrates a schematic cross-sectional view of a conventional integrated circuit (IC) package 100. As shown, the conventional IC package 100 includes, without limitation, a lid 102, a die 104, microbumps 106, a substrate 108, solder balls 110, a solder dam 116 surrounding the die 104, and chip capacitor pads 118 located outside the solder dam 116. The microbumps 106 are immersed in under-fill 114, which serves to support and secure the placement of microbumps 106 and die 104 within the IC package 100. By way of example and not limitation, die 104 may include one or more devices such as a central processing unit, a graphics processing unit, a memory device or any combination thereof to form a system-on-chip device. Lid 102 is coupled to substrate 108 with a lid adhesive (not shown). Lid 102 is configured to shield and protect the die 104. As also shown, IC package 100 is coupled to a printed circuit board (PCB) 112 with solder balls 110.

As discussed above, consumer demand has trended towards thinner electronic devices, which, in turn, has increased demand for thinner IC packages. Because of advances in reducing the height of IC packages, solder dams in IC package designs have begun causing fabrication issues. These issues are described below in conjunction with FIG. 2.

Figure 2:
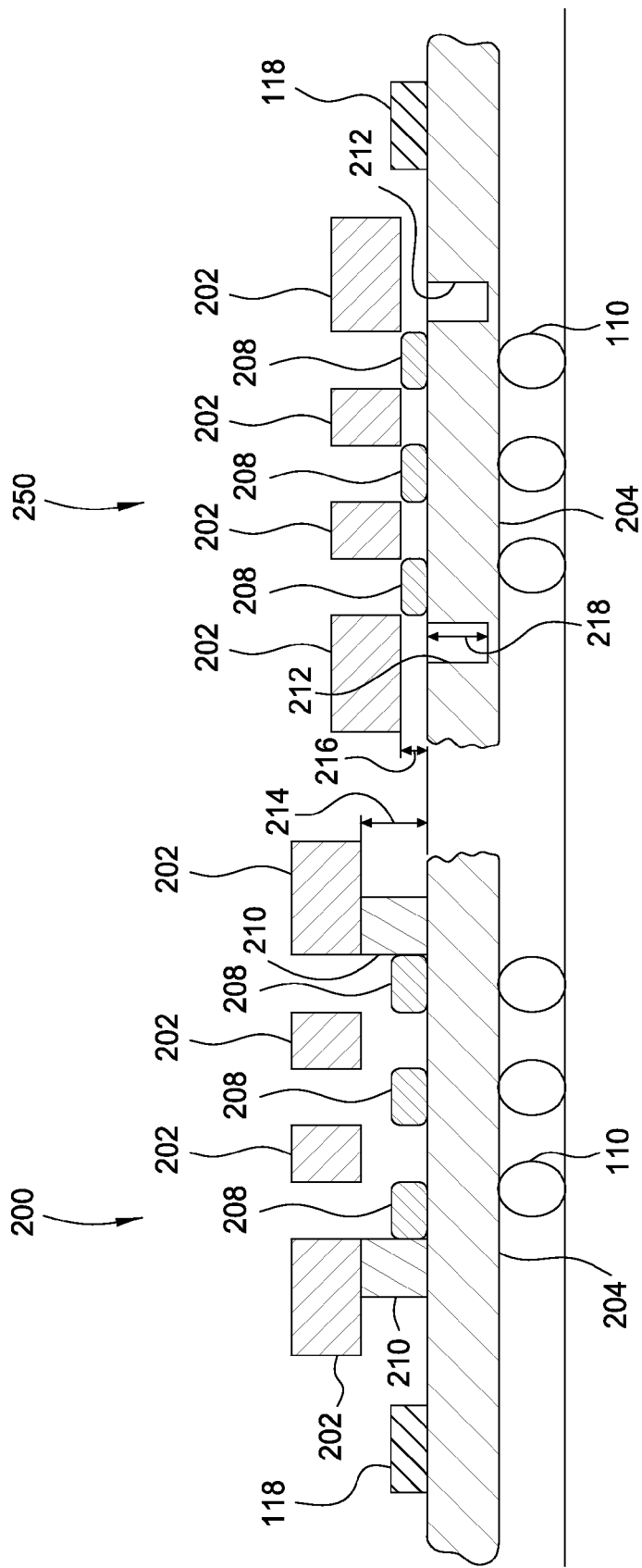
FIG. 2 illustrates an implementation of a conventional solder dam design as well as a solder trench design, according to one embodiment of the invention.

FIG. 2 illustrates an implementation of a conventional solder dam design as well as a solder trench design, according to embodiment of the invention. As shown, a conventional IC package 200 includes, without limitation, a substrate 204, solder balls 110, a solder dam 210 surrounding the C4 pads 208, and chip capacitor pads 118 surrounding the solder dam 210. Solder dam 210 is substantially similar to solder dam 116 of FIG. 1 and has a height 214. As is well-known, the fabrication process includes the use of stencil 202 in order to direct the deposition of solder paste (not shown) onto the substrate 204. In practice, stencil 202 is typically lowered towards substrate 204 before the solder paste (not shown) is deposited onto the substrate 204 to form C4 pads 208.

A common problem occurs when a solder dam is too tall. For example if solder dam 210 is too tall, then solder dam 210 may obstruct stencil 202 as stencil 202 is lowered towards substrate 204, thereby preventing stencil 202 from being lowered to an appropriate distance 216 from the substrate 204. If stencil 202 is located too far from the substrate 204, then properly depositing the solder paste (not shown) onto the substrate 204 becomes quite difficult. Again, imprecise deposition of solder paste is undesirable because improper deposition may result in incomplete electrical connections in the IC package, which could cause the IC package to malfunction or become inoperable. Also, if the solder dam is too tall, the solder dam could interfere with attempts to reduce the overall height of the IC package.

FIG. 2 also illustrates the use of a solder trench 212 within an IC package 250. Here, solder dam 210 has been replaced with solder trench 212. Because IC package 250 no longer includes any solder dams, the problems described above resulting from the solder dams interfering with stencil 202 and interfering with attempts to reduce the overall height of the IC package 250 are addressed. More specifically, as is evident with respect to IC package 250, solder trench 212 allows the stencil 202 to be placed quite close to substrate 204 to allow the solder paste (not shown) to be deposited more accurately for the formation of C4 pads 208. Accurately depositing solder paste on substrate 204, among other things, reduces the number of improperly built or malfunctioning IC packages, thereby increasing yield and lowering overall production cost. Further, because the solder dams are no longer present, the solder dams no longer need to be accommodated when trying to reduce the overall height of the IC package 250.

Also as shown in 250 in FIG. 2, an additional benefit of solder trench 212 is that solder trench 212 may have a depth 218 that is greater than height 216, thereby allowing for more under-fill 114 to be captured and held. Further, because solder trench 212 does not impact the positioning of stencil 202 relative to substrate 204, solder trench 212 may be formed with less precision than solder dam 210. Thus, the process of forming a more precise solder dam structure is replaced with a less precise process of forming a solder trench, which results in reduced complexity in IC package fabrication and reduced overall cost.

Figure 3:
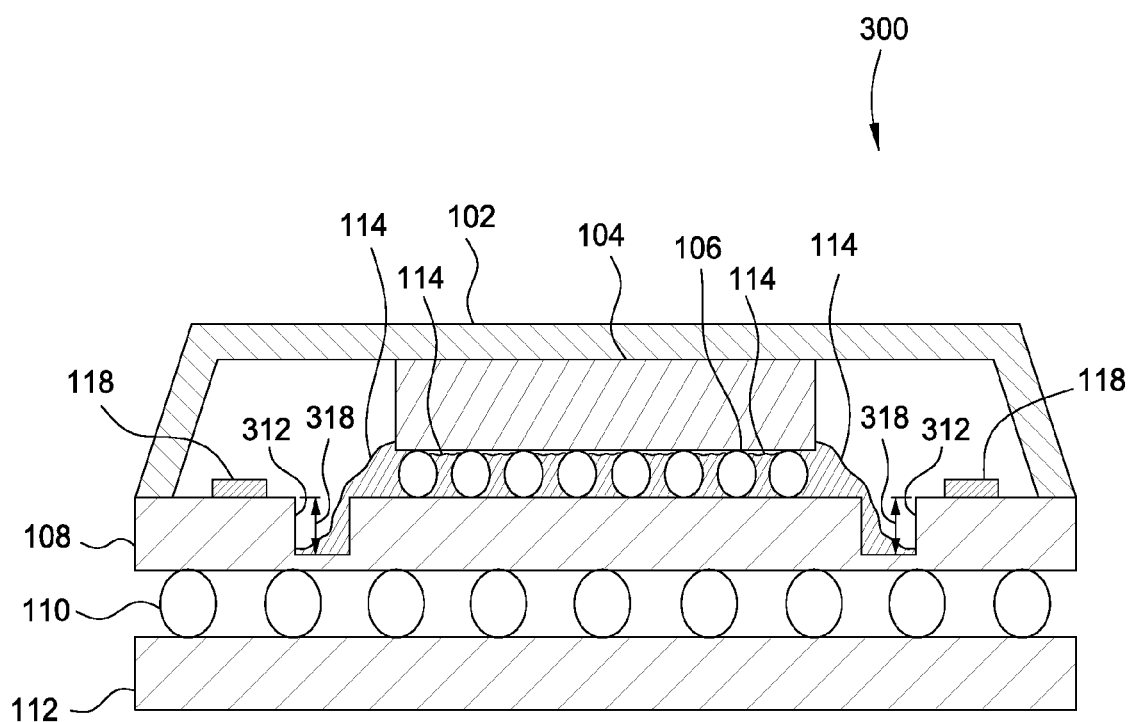
FIG. 3 illustrates a cross-sectional view of a solder trench, according to one embodiment of the invention.

FIG. 3 illustrates an implementation of an embodiment of the invention in the form of a solder trench 212. As shown, and similar to IC package 250, IC package 300 is substantially similar to IC package 100 of FIG. 1 except that solder dam 116 of FIG. 1 is replaced with a solder trench 312 having a depth 318. By implementing solder trench 312, the problem of under-fill 114 flow onto chip capacitor pads 118 is avoided because under-fill flow 114 flows into solder trench 312. In other words, excess under-fill 114 is captured in solder trench 312 instead of being contained by solder dam 116, as in conventional designs.

Figure 4:
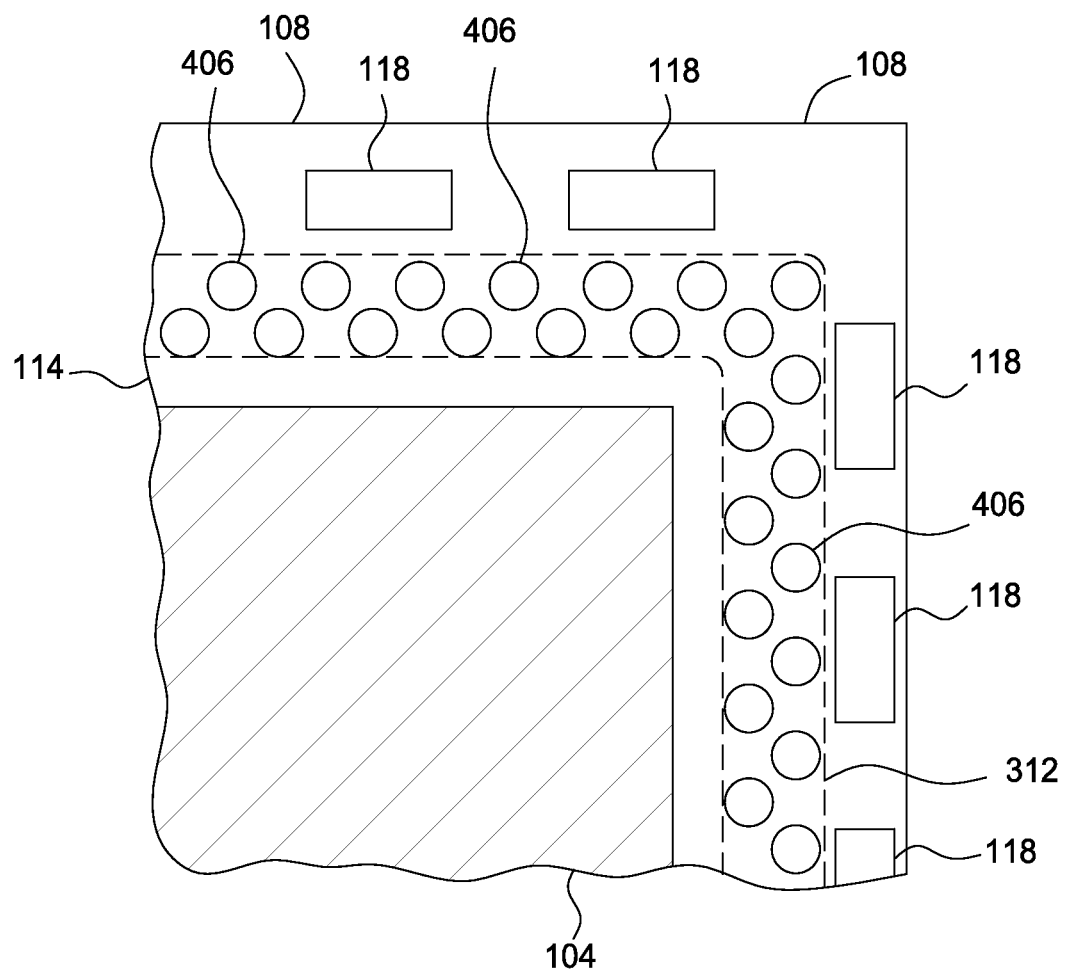
FIG. 4 illustrates one configuration of the solder trench of FIG. 3, according to one embodiment of the invention.

FIG. 4 illustrates one configuration of the solder trench 312 of FIG. 3, according to one embodiment of the invention. As shown, the solder trench 312 includes numerous individual apertures 406 arranged in a predetermined pattern. Those skilled in the art will appreciate that the aggregate volume of the different apertures 406 should be great enough to capture and hold excess under-fill 114 so that the under-fill 114 does not reach chip capacitors 118 during fabrication.

As shown, the apertures 406 are disposed in a staggered arrangement such that there is no direct flow path through the solder trench 312 to the chip capacitors 118 for the under-fill 114 to follow, thereby decreasing the likelihood that the under-fill 114 would reach the chip capacitors 118 during fabrication. In other embodiments, however, the apertures 406 may be disposed in any arrangement, and all technically feasible arrangement fall within the scope of the present invention.

Apertures 406 are advantageously cylindrically shaped to reduce the amount of stress placed on substrate 108. For example, as persons skilled in the art will appreciate, designing a solder trench with squared or cornered features, such as a corner, would increase the local stresses placed on substrate 108, thereby increasing the likelihood of fracture or other failure.

Figure 5:
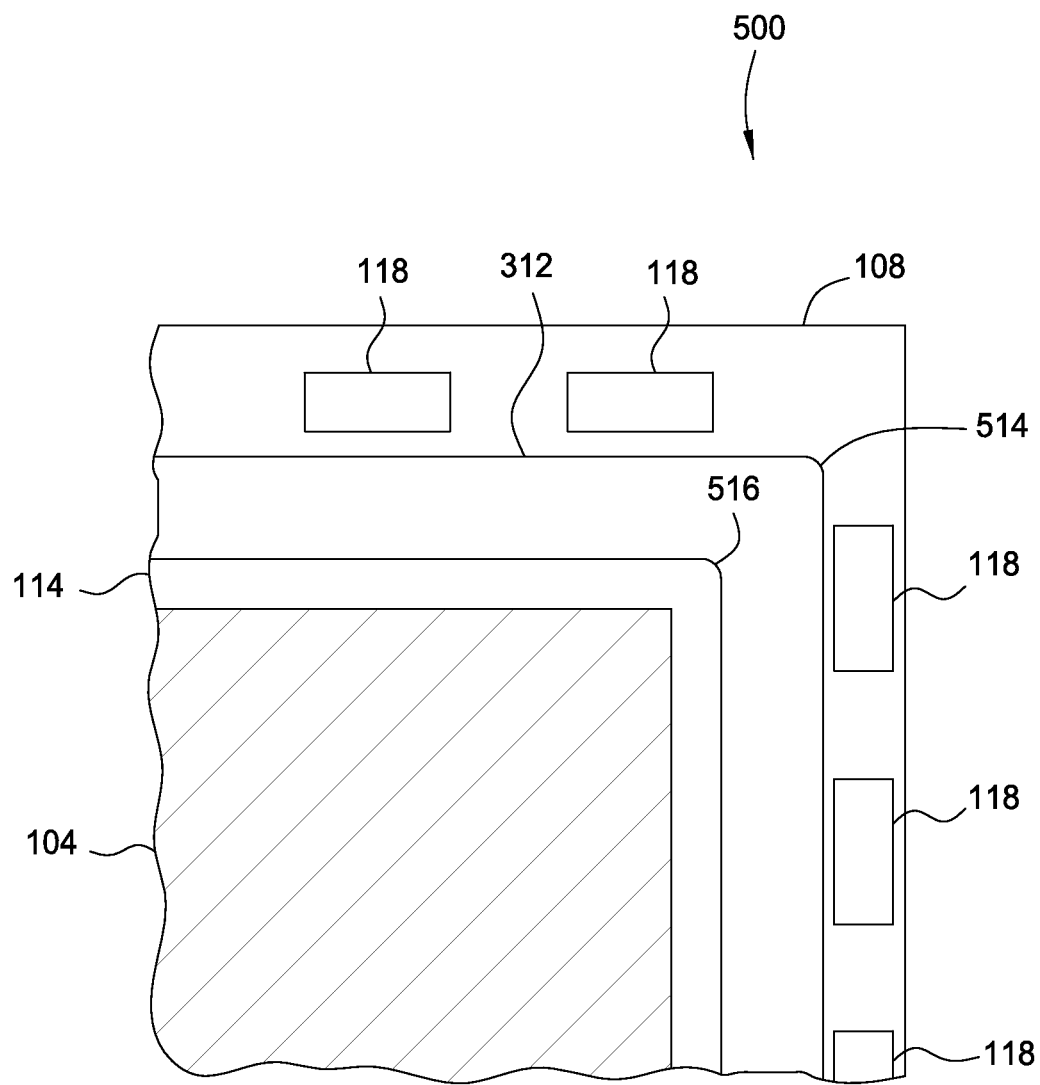
FIG. 5 illustrates another configuration of the solder trench of FIG. 3, according to another embodiment of the invention.

FIG. 5 illustrates another configuration of a solder trench 312 that may be implemented in the IC package 300 of FIG. 3, according to another embodiment of the invention. As shown, solder trench 312 comprises a continuous trench disposed around the periphery of substrate 108 between die 104 and chip capacitors 118. Again, trench 312 should be designed to have an internal volume great enough to capture and hold excess under-fill 114 so that under-fill 114 does not reach chip capacitors 118 during fabrication. Again, solder trench 312 is configured with rounded edges 514 and 516 to reduce the amount of stress placed on substrate 108, thereby reducing the likelihood of fracture or other failure.

Persons skilled in the art will understand that IC packages designed according to the disclosed techniques may be included and implemented in any type of computing device such as, for example, a cellular telephone, a tablet computer, a handheld computing device, a personal digital assistant, a laptop computer, a desktop computer, or the like.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

What is claimed is:

1. An integrated circuit package, comprising:
    a substrate;
    one or more devices mounted on the substrate;
    one or more electrical connections disposed between the substrate and the one or more devices;
    a layer of under-fill configured to secure the one or more devices on the substrate; and
    a solder trench formed in the substrate, wherein the aggregate volume of the solder trench is large enough to capture a flow of excess under-fill during fabrication, and wherein the solder trench is comprised of a plurality of cylindrical apertures formed in the substrate, wherein the cylindrical apertures are arranged in a staggered pattern relative to one another.

2. The integrated circuit package of claim 1, wherein the apertures are arranged such that the excess under-fill cannot flow directly between the one or more devices and at least one capacitor pad disposed on the substrate.

3. The integrated circuit package of claim 1, wherein the solder trench comprises a channel formed in the substrate.

4. The integrated circuit package of claim 3, wherein the solder trench is disposed on all four sides of at least one device mounted on the substrate and has rounded edges at each corner.

5. The integrated circuit package of claim 1, wherein the solder trench is used to capture the flow of excess under-fill instead of at least one solder dam structure preventing the flow of excess under-fill.

6. The integrated circuit package of claim 5, wherein using the solder trench in lieu of the at least one solder dam structure enables a stencil to be disposed closer to a top surface of the substrate during fabrication relative to when the at least one solder dam structure is used.

7. The integrated circuit package of claim 6, wherein the stencil is used to deposit solder paste during fabrication.

8. The integrated circuit package of claim 1, wherein the one or more devices comprise a central processing unit, a graphics processing unit, or a system-on-chip.

9. A computing device, comprising:
   an integrated circuit package that includes:
      a substrate;
      one or more devices mounted on the substrate;
      one or more electrical connections disposed between the substrate and the one or more devices;
      a layer of under-fill configured to secure the one or more devices on the substrate; and
      a solder trench formed in the substrate, wherein the aggregate volume of the solder trench is large enough to capture a flow of excess under-fill during fabrication, and wherein the solder trench comprises a rectangle that is disposed in the surface of the substrate and includes rounded corners also disposed in the surface of the substrate where said rounded corners reduce the amount of stress placed on the substrate.

10. The computing device of claim 9, wherein the solder trench comprises a channel formed in the substrate.

11. The computing device of claim 9, wherein the solder trench is used to capture the flow of excess under-fill instead of at least one solder dam structure preventing the flow of excess under-fill.

12. The computing device of claim 11, wherein using the solder trench in lieu of the at least one solder dam structure enables a stencil to be disposed closer to a top surface of the substrate during fabrication relative to when the at least one solder dam structure is used.

13. The computing device of claim 12, wherein the stencil is used to deposit solder paste during fabrication.

14. The computing device of claim 9, wherein the one or more devices comprise a central processing unit, a graphics processing unit, or a system-on-chip.

15. The computing device of claim 9, wherein the rounded corners of the solder trench induce an amount of stress in the substrate that is less than an amount of stress induced in the substrate by non-rounded corners.

* * * * *